United States Patent
Lee et al.

(10) Patent No.: US 9,876,026 B2
(45) Date of Patent: Jan. 23, 2018

(54) METHOD OF MANUFACTURING SEMICONDUCTOR DEVICE

(71) Applicant: SK hynix Inc., Gyeonggi-do (KR)

(72) Inventors: Hee Youl Lee, Gyeonggi-do (KR); Chul Young Ham, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/962,312

(22) Filed: Dec. 8, 2015

(65) Prior Publication Data

US 2017/0012051 A1    Jan. 12, 2017

(30) Foreign Application Priority Data

Jul. 10, 2015  (KR) .................. 10-2015-0098495

(51) Int. Cl.
*H01L 21/324* (2006.01)
*H01L 27/11582* (2017.01)
*H01L 21/28* (2006.01)

(52) U.S. Cl.
CPC .. *H01L 27/11582* (2013.01); *H01L 21/28282* (2013.01); *H01L 21/324* (2013.01)

(58) Field of Classification Search
CPC ............. H01L 27/11582; H01L 21/324; H01L 21/28282; H01L 438/287; H01L 21/823462; H01L 21/823857; H01L 29/7808; H01L 27/11273; H01L 29/7802; H01L 29/66712

See application file for complete search history.

(56) References Cited

U.S. PATENT DOCUMENTS

| | | | |
|---|---|---|---|
| 2010/0140684 A1* | 6/2010 | Ozawa | H01L 21/28282 257/324 |
| 2014/0084357 A1* | 3/2014 | Choi | H01L 27/1157 257/324 |
| 2015/0348784 A1* | 12/2015 | Granahan | H01L 21/225 257/622 |

FOREIGN PATENT DOCUMENTS

KR    1020120060480    6/2012

* cited by examiner

*Primary Examiner* — Julio J Maldonado
*Assistant Examiner* — Stanetta Isaac
(74) *Attorney, Agent, or Firm* — IP & T Group LLP

(57) ABSTRACT

The present disclosure provides a method of manufacturing a semiconductor device with a controlled doped concentration of a channel film that is run-through a plurality of memory stacks. In one aspect of the present disclosure, the method may include forming a hole, forming a channel film on an inner surface of the hole, forming a buffer film on an inner surface of the channel film, forming a dopant supply film to fill the hole, and doping the channel film via a dopant diffusion from the dopant supply film into the channel film.

19 Claims, 10 Drawing Sheets

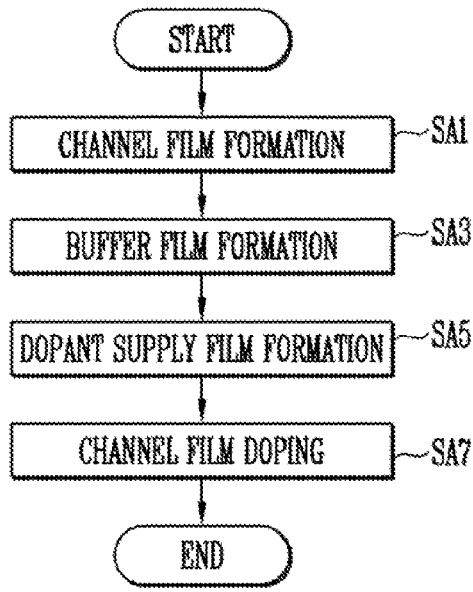
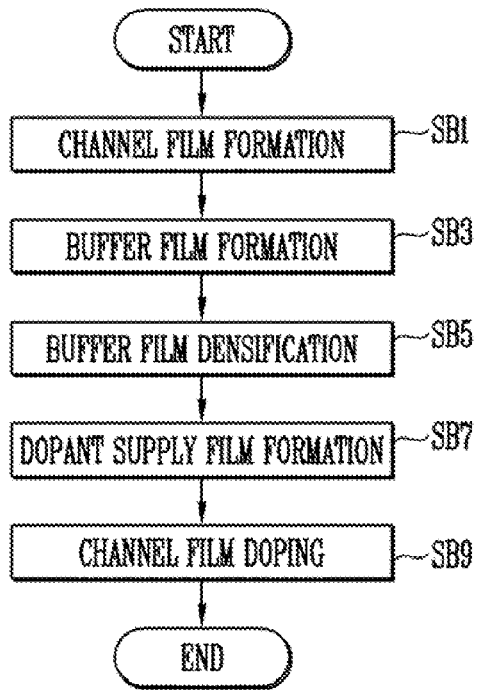

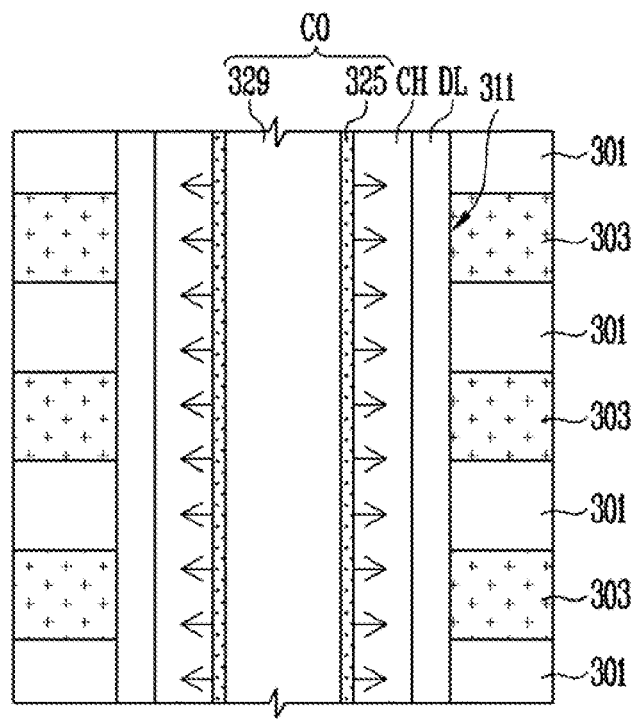
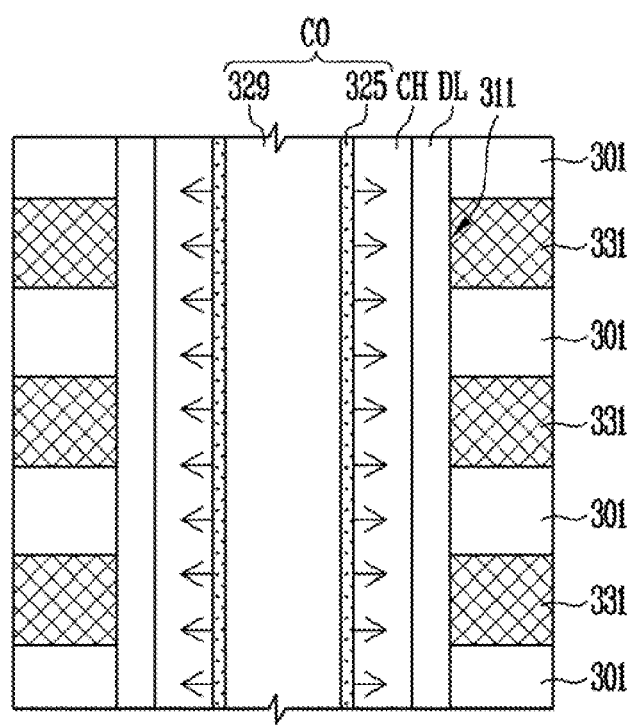

METHOD OF MANUFACTURING SEMICONDUCTOR DEVICE

CROSS-REFERENCE TO RELATED APPLICATION

The present application claims priority to Korean patent application number 10-2015-0098495 filed on Jul. 10, 2015, the entire disclosure of which is herein incorporated by reference.

BACKGROUND

Technical Field

Embodiments of the present disclosure relate to a method of manufacturing a semiconductor device, and, in particular, to a method of manufacturing a semiconductor device including a channel film passing-through stacks.

Discussion of Related Arts

For high-integration of semiconductor devices, a 3D (3-dimensional) memory device architecture has been suggested. Memory cells are stacked in a three dimensional manner on a substrate. In this architecture, the memory cells may be connected to one another via a channel film extending in a stacking direction of the memory cells. The channel film may be constructed to pass-through a plurality of stacks, each stack having a conductive pattern and insulation film. In this structure, it may be difficult to dope impurities into the channel film and thus secure a desired doping concentration in the channel film. This may lead to degradation in a reliability of the 3D memory device.

SUMMARY

The present disclosure provides a method of manufacturing a semiconductor device with controlled doping concentration of a channel film which run-throughs a plurality of memory stacks.

In one aspect of the present disclosure, there is provided a method for manufacturing a semiconductor device, the method comprising: forming a hole passing through a stack, wherein the stack includes first and second material films; forming a channel film over an inner surface of the hole; forming a buffer film over an inner surface of the channel film; forming a dopant supply film being in contact with the buffer film and filling the hole; and doping the channel film by dopant diffusion from the dopant supply film into the channel film.

In one aspect of the present disclosure, there is provided a method for manufacturing a semiconductor device, the method comprising: forming a hole passing through a stack, wherein the stack includes first and second material films; forming a channel film over an inner surface of the hole; forming a dopant supply film over an inner surface of the channel film; forming a gap-fill insulation film being in contact with the dopant supply film and filling the hole; and performing heat treatment to dope the channel film by dopant diffusion from the dopant supply film into the channel film and to anneal the gap-fill insulation film.

In one aspect of the present disclosure, there is provided a method for manufacturing a semiconductor device, the method comprising: forming a hole passing through a stack, wherein the stack includes first and second material films; forming a channel film over an inner surface of the hole; forming a buffer film over an inner surface of the channel film; forming a dopant supply film over an inner surface of the buffer film; forming a gap-fill insulation film over an inner surface of the dopant supply film and filling the hole; and doping the channel film by dopant diffusion from the dopant supply film into the channel film.

BRIEF DESCRIPTION OF THE DRAWINGS

FIG. 2A and FIG. 2B illustrate flow charts for methods to form doped channel films in accordance with embodiments of the present disclosure.

FIG. 7A and FIG. 7B illustrate cross-sectional views corresponding to various stages in the method of manufacturing the semiconductor device in accordance with an embodiment of the present disclosure.

DETAILED DESCRIPTION

Figure 1A:
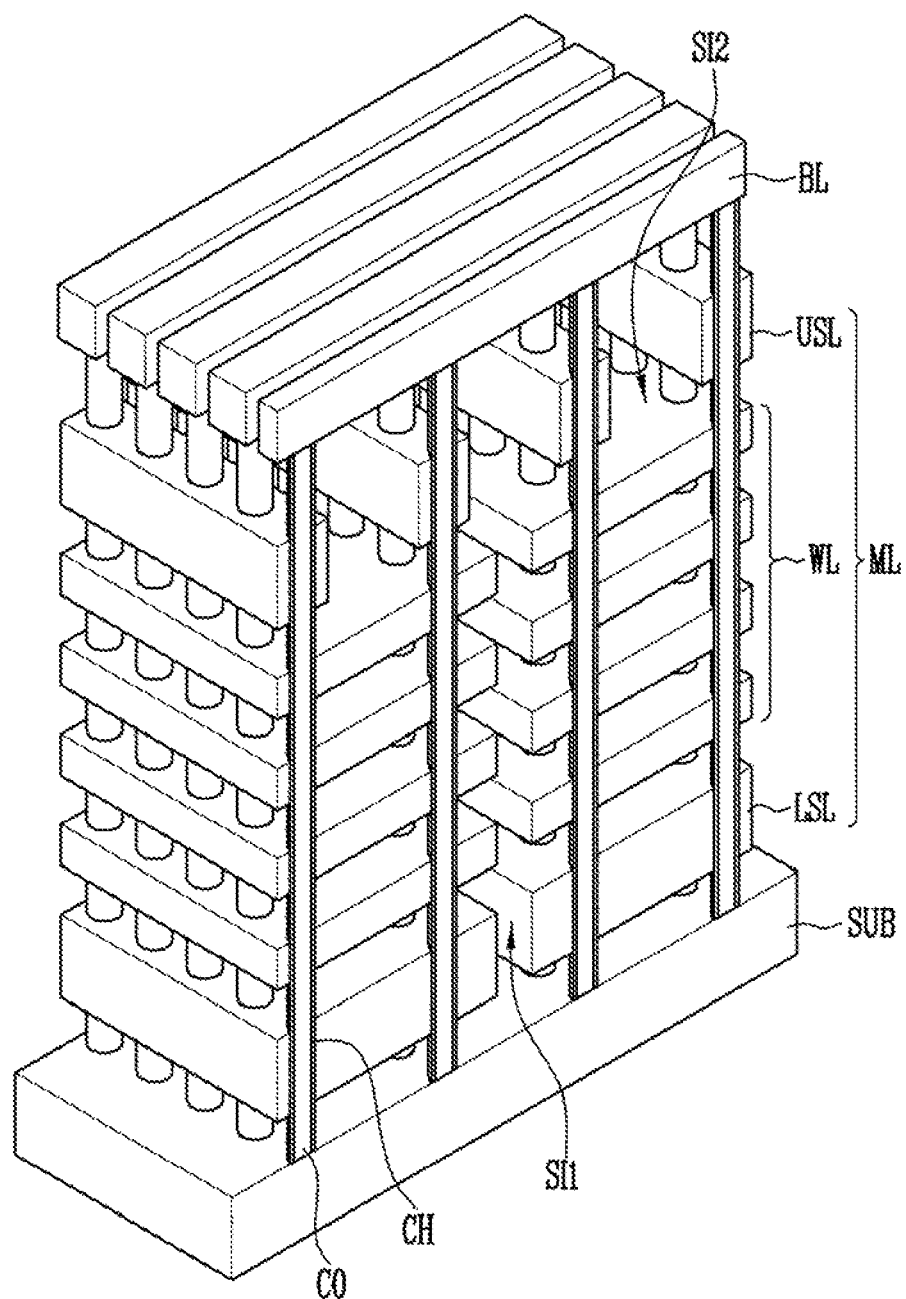
FIG. 1A and FIG. 1B illustrate respective perspective views of cell-string architectures of semiconductor devices in accordance with embodiments of the present disclosure.

Examples of various embodiments are illustrated in the accompanying drawings and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

Example embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms, used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or an overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to attached drawings.

Figure 1B:
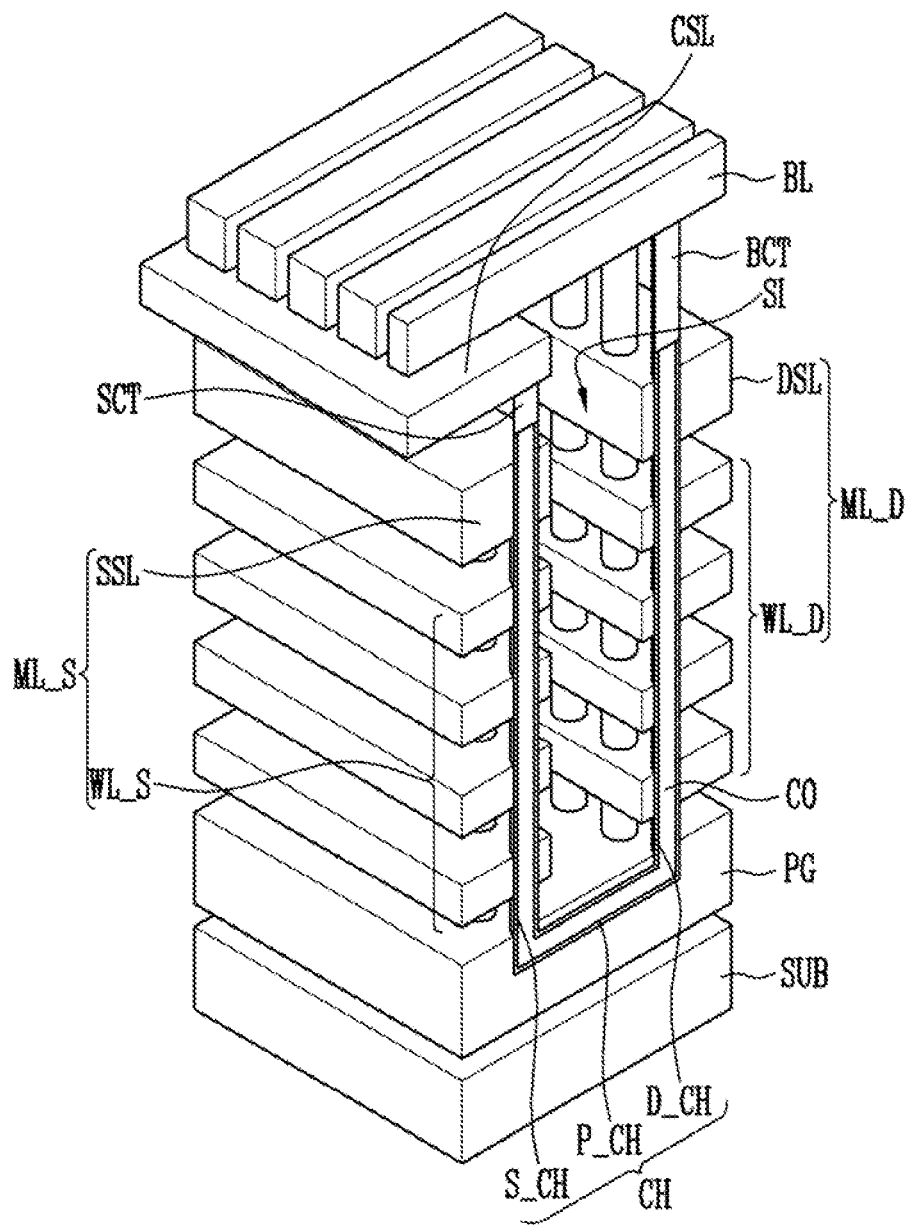

FIG. 1A and FIG. 1B are respective perspective views of cell-string architectures of semiconductor devices in accordance with embodiments of the present disclosure. To be specific, FIG. 1A is a perspective view of a straight type of cell-string architecture, and FIG. 1B is a perspective view of a U-shape type of cell-string architecture. For the sake of convenience of description, in FIG. 1A and FIG. 1B, insulation films and data storage films are not shown.

Referring to FIG. 1A, each of cell-strings may be formed along a straight type of channel films CHs. A straight type of the cell-string may be electrically coupled to one another between a semiconductor substrate SUB with a source region and a bit line BL. Between the semiconductor substrate SUB and bit line BL, cell stacks MLs are provided. Each cell stack includes conductive patterns LSL, WL, and USL. The conductive patterns are stacked in a spaced manner.

The cell stacks ML may be separated from each other via a first slit SI1.

The semiconductor substrate SUB having the source region may be connected to bottoms of the channel films CH. The source region may be formed by impurities-doping into the semiconductor substrate SUB or may be formed by a deposition of a doped silicon film on the semiconductor substrate SUB.

The conductive patterns LSL, WL, USL may surround the channel film CH, may include a lower selection line LSL, word-lines WLs, and an upper selection line USL, and may be arranged or stacked vertically. The lower selection line LSL may be disposed between the word-lines WLs and semiconductor substrate SUB. Although a single layer of the lower selection line LSL is shown, there may be multiple vertical layers of LSLs. The upper selection line USL may be disposed between the word-lines WLs and the bit line BL. Although a single layer of the upper selection line USL is shown, there may be multiple vertical layers of USLs.

Either the lower selection line LSL or the upper selection line USL may have a larger number of horizontal sub-divisions than those of each of the word-lines WLs. For example, as shown in FIG. 1A, each horizontal sub-division of each word-line WLs may be configured to surround two rows of the channel films CHs, and each horizontal sub-division of each upper selection line USL may be configured to surround a single row of the channel films CHs. In this case, the sub-divisions of the upper selection line USL may be separated from each other via the first slit SI1 and a second slit SI2. The first slit SI1 extends between the bit line BL and the substrate SUB, and the second silt extends between the bit line BL and the upper-most word-line.

The channel film CH may extend-through the conductive patterns LSL, WL, and USL. Additionally, although not shown in the drawing, there may be disposed a tunnel insulation film, a charge trap film and a charge block film between the channel film CH and conductive patterns LSL, WL, and USL. The tunnel insulation film may be constructed to contact the channel film CH and surround the channel film CH. The charge trap film may be constructed to contact the tunnel insulation film and surround the tunnel insulation film. The charge block film may be constructed to contact the charge trap film and surround the charge trap film. A top of each of the channel films CH may be electrically connected to the bit line BL.

In accordance with the above architecture, memory cells may be disposed respectively at intersections between the channel films CH and word-lines WLs. Lower selection transistors may be disposed respectively at intersections between the channel films CHs and lower selection line LSL.

Upper selection transistors may be disposed respectively at intersections between the channel films CHs and upper selection line USL. A single cell-string may be formed of a serial vertical arrangement of the lower selection transistor, memory cells, and upper selection transistor along a single channel film CH.

Referring to FIG. 1B, the cell-string may be configured to extend along a channel film CH and connected between a bit line BL and a common source line CSL. Although FIG. 1B illustrates a U-shaped channel film CH, the channel film CH may be formed in different shapes, for example, in a W shape and the like. Layers of the bit line BL and common source line CSL may be different in structure and be spaced from each other. For example, the common source line CSL may be disposed under the bit line BL. The bit line BL and common source line CSL may be made of conductive materials.

Under the bit line BL and common source line CSL, there may be disposed a pipe gate PG. The pipe gate PG may be made of a conductive material. The pipe gate PG may be disposed on a substrate SUB.

On the pipe gate PG, there may be disposed a drain-side cell stack ML_D and source-side cell stack ML_S. The drain-side cell stack ML_D and source-side cell stack ML_S may be disposed under the bit line BL and common source line CSL. The drain-side cell stack ML_D and source-side cell stack ML_S may be electrically separated from each other via a slit SI and may sandwich the slit SI therebetween.

The drain-side cell stack ML_D may include drain-side conductive patterns WL_D and DSL which may be vertically stacked in a spaced manner. The source-side cell stack ML_S may include source-side conductive patterns WL_S and SSL which may be vertically stacked in a spaced manner. The drain-side conductive patterns WL_D and DSL may include drain-side word-lines WL_Ds and a drain selection line DSL. The drain-side word-lines WL_Ds may be vertically stacked in a spaced manner.

The drain-side word-lines WL_Ds may be disposed between the bit line BL and pipe gate PG. The drain selection line DSL may be disposed between the bit line BL and drain-side word-lines WL_Ds. Although a single layer of the drain selection line DSL is shown, there may be multiple vertical layers of DSLs in another embodiment.

The source-side conductive patterns WL_S and SSL may include source-side word-lines WL_Ss and a source selection line SSL. The source-side word-lines WL_Ss may be vertically stacked in a spaced manner. The source-side word-lines WL_Ss may be disposed between the common source line CSL and pipe gate PG. The source selection line SSL may be disposed between the common source line CSL and source-side word-lines WL_Ss. Although a single layer of the source selection line SSL is shown, there may be multiple vertical layers of SSLs in another embodiment.

The channel film CH may include a drain-side channel film D_CH passing-through the drain-side cell stack ML_D, a source-side channel film S_CH passing-through the source-side cell stack ML_S, and the pipe channel film P_CH. The pipe channel film P_CH may run through the pipe gate PG to enable connection between the drain-side channel film D_CH and source-side channel film S_CH. Additionally, although not shown, an outer wall of the channel film CH may be surrounded with the tunnel insulation film, charge trap film and charge block film. A top of the drain-side channel film D_CH may be electrically connected via a bit line contact plug BCT to the bit line BL. A top of the source-side channel film S_CH may be electrically connected via a source contact plug SCT to the common source line CSL.

In the above architecture, source-side memory cells may be respectively formed at intersections of the channel film CH and source-side word-lines WL_Ss; a source selection transistor may be formed at an intersection of the channel film CH and source selection line SSL; drain-side memory cells may be respectively formed at intersections of the channel film CH and drain-side word-lines WL_Ds; a drain selection transistor may be formed at an intersection of the channel film CH and drain selection line DSL; and a pipe transistor may be formed at an intersection of the channel film CH and pipe gate PG. Along the single channel film CH, the source selection transistor, source-side memory cells, pipe transistor, drain-side memory cells, and drain selection transistor may be arranged in a serial manner to form a single cell-string.

As described above with referring to FIG. 1A and FIG. 1B, the cell-string may include the memory cells vertically stacked along the channel film CH, resulting in the 3D architecture memory array. The channel film CH may be made of a doped semiconductor film to secure a cell current of the cell-string. For example, the channel film CH may be made of a doped silicon film. The channel film CH may be formed in a tube structure for easy supply of dopant thereto. The channel film CH may be constructed to surround a core structure CO.

The core structure CO may include a dopant supply film to allow a supply of a dopant into the channel film CH. The core structure CO may further include a buffer film disposed between the dopant supply film and channel film CH to control a dopant concentration to be doped into the channel film CH. The core structure CO may further include a gap-fill insulation film surrounded with the dopant supply film. Hereinafter, with reference to FIG. 2A to FIG. 7B, various implementations of a method to form the doped channel film CH surrounding the core structure CO will be described.

FIG. 2A and FIG. 2B are respective flow-diagrams of a method to form a doped channel film in accordance with embodiments of the present disclosure.

With reference to FIG. 2A and FIG. 2B, in a SA1 step or SB1 step, a channel film may be formed along a surface of a hole which passes through previously-formed stacks. The channel film may be formed in a tube structure along/on an inner surface of the hole so as to secure a uniform thickness, and may be made of an un-doped semiconductor film. For example, the channel film may be formed in a tube structure made of an un-doped silicon film and have a uniform thickness.

Next, in a SA3 step or SB3 step, a buffer film may be formed along a surface of the formed channel film. Various formation processes and properties of the buffer film are described below with reference to FIG. 6. The buffer film may be formed to be thin enough so that a central region of the hole is hollow, and, thus, the buffer film may be structured in a tube form.

The buffer film may serve to control a diffusion concentration of dopants into channel film from a dopant supply film, which will be formed later, and thus control a doping concentration in the channel film. For example, in order to prevent an excessive increase in a dopant amount passing through the buffer film, the buffer film may be subjected to an annealing to densify the buffer film in a SB5 step as shown in FIG. 2B. This annealing treatment may allow the buffer film to have a higher density than that in the SB3 step. In a certain case, the SB5 step may be omitted as indicated in FIG. 2A.

After the SA3 step or SB5 step, the dopant supply film may be formed to completely fill the remaining hole in a SA5 step or SB7 step. The dopant supply film may serve to supply dopants into the channel film, and, to this end, may contain dopants with a higher concentration than that in the channel film.

The dopant supply film may contain N-type impurities or P-type impurities or a combination thereof. The N-type impurities may diffuse into the channel film in a subsequent stage to lower a potential barrier, and, thus, to increase a carrier amount. The channel film with the increased carrier amount may enhance a cell current, so that a sensing time may be reduced during a reading operation of the cell-string, and threshold voltage distributions dependent on data storage states may be narrowed. The P-type impurities may diffuse into the channel film in a subsequent stage to enhance natural threshold voltages of the memory cells forming the cell-string and a threshold voltage of a selection transistor. The present disclosure may improve an operating reliability of the cell-string because of a reduction of a leakage current from the cell-string using the selection transistor with the enhanced threshold voltage. The buffer film containing the N-type impurities may employ a PhosphoSilicate Glass ("PSG"). The buffer film containing the P-type impurities may employ a Borosilicate Glass ("BSG"). The buffer film containing a combination of the N-type impurities and P-type impurities may employ a BoroPhosphoSilicate Glass ("BPSG").

The type of buffer film may be selected based on a target characteristic of the channel film. For example, in case of targeting the cell current enhancement, the buffer film may employ the PSG film. In case of targeting the threshold voltage enhancement, the buffer film may employ the BSG film. In case of targeting both of the threshold voltage and cell current enhancement, the buffer film may employ the BPSG film. Further, the concentration of the N-type impurities and/or P-type impurities in the buffer film may vary depending on desired characteristics of the channel film.

After the SA5 step or SB7 step, dopants may diffuse from the dopant supply film into the channel film to dope the channel film in a SA7 step or SB9 step. To this end, the dopant supply film may be heated. The dopant diffusion may be implemented by a heating treatment to reflow the dopant supply film. The reflow may allow a mobility of the dopant supply film to facilitate a filling of the dopant supply film into the hole without voids or seams.

FIG. 3A to FIG. 3E illustrate cross-sectional views corresponding to various stages in a manufacturing method of a semiconductor device as above described with reference to FIG. 2A or FIG. 2B.

Figure 3A:
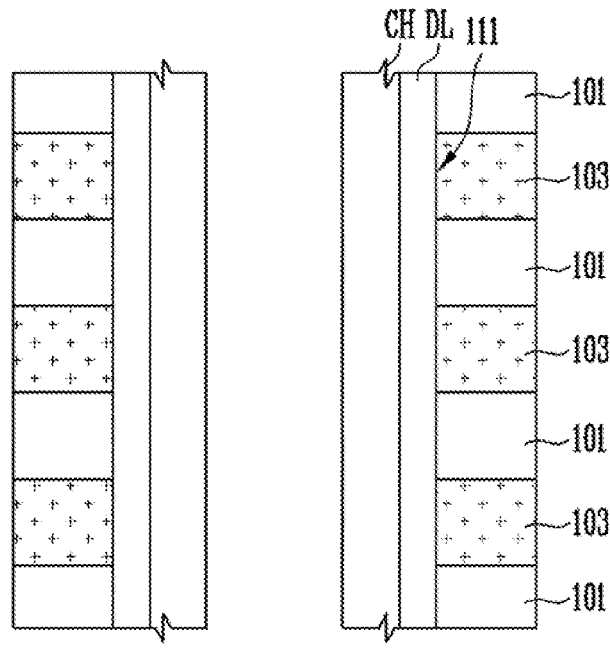
FIG. 3A to FIG. 3E illustrate cross-sectional views corresponding to various stages in a manufacturing method of a semiconductor device as above described with reference to FIG. 2A or FIG. 2B.

Referring to FIG. 3A, each of first material films 101 and each of second material films 103 may be alternately stacked on a substrate (not shown) having an underlying structure. The underlying structure may include the substrate SUB with the source region as shown in FIG. 1A or include the substrate SUB with the pipe gate PG as shown in FIG. 1B.

In an embodiment, the first material films 101 and second material films 103 may have different materials from each other. For example, the first material films 101 may be made of insulation materials while the second material films 103 may be made of conductive materials. In another embodiment, the first material films 101 and second material films 103 may be respectively made of insulation materials with different etching selection ratio. For example, the first material films 101 may be made of oxide films while the second material films 103 may be made of sacrificial nitride films. In yet another embodiment, the first material films 101 and second material films 103 may respectively be made of conductive materials with different etching selection ratio. For example, the first material films 101 may be made of sacrificial un-doped silicon films while the second material films 103 may be made of doped silicon films, which are conductive patterns.

Thereafter, the first material films 101 and second material films 103 may be etched to form a hole 111 passing-through the first material films 101 and the second material films 103. The hole 111 may be a filing region of the channel film CH and core structure CO as shown in FIG. 1A, or a filling region of the drain-side channel film D_CH and core structure CO as shown in FIG. 1B, or a filling region of the source-side channel film S_CH and core structure CO as shown in FIG. 1B.

Next, along/on an inner surface of the hole 111, a channel film CH may be formed. The channel film CH may be formed in the SA1 step or SB1 step as shown in FIG. 2A and FIG. 2B.

Before the formation of the channel film CH, a data storage film DL with a single or multiple-layer structure may be formed along/on an inner surface of the hole 111. The data storage film DL may include a tunnel insulation film surrounding an outer wall of the channel film CH, and a charge trap film surrounding the tunnel insulation film. The data storage film DL may further include a charge block film surrounding the charge trap film.

The tunnel insulation film may be made of a silicon oxide film. The charge trap film may be made of a material film with a charge trap function. For example, the charge trap film may be made of a silicon nitride film. The charge block film may be made of at least one of a silicon oxide film and a dielectric film with a higher dielectric constant than the silicon oxide film.

Figure 3B:
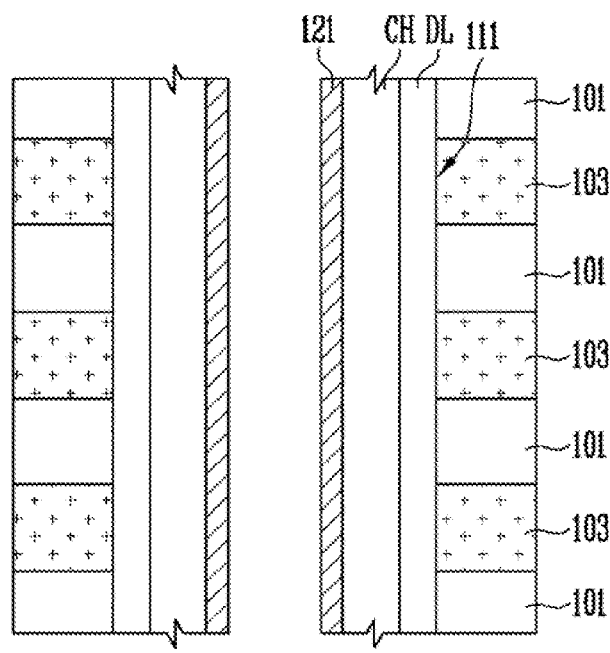

Referring to FIG. 3B, along the channel film CH surface, a buffer film 121 may be formed. The buffer film 121 may be in a contact with the channel film CH. The buffer film 121 may be formed in the SA3 step or SB3 step as described above with reference to FIG. 2A and FIG. 2B. The buffer film 121 may be constructed to form a hollow tube structure. The hollow tube buffer film 121 may be formed using a Low Pressure Chemical Vapor Deposition ("LPCVD"), Plasma Enhanced Chemical Vapor Deposition ("PECVD"), Atomic layer deposition ("ALD") or the like.

Subsequently, an annealing treatment may be performed to densify the buffer film 121 in the SB 5 step as described above with reference to FIG. 2B.

Figure 3C:
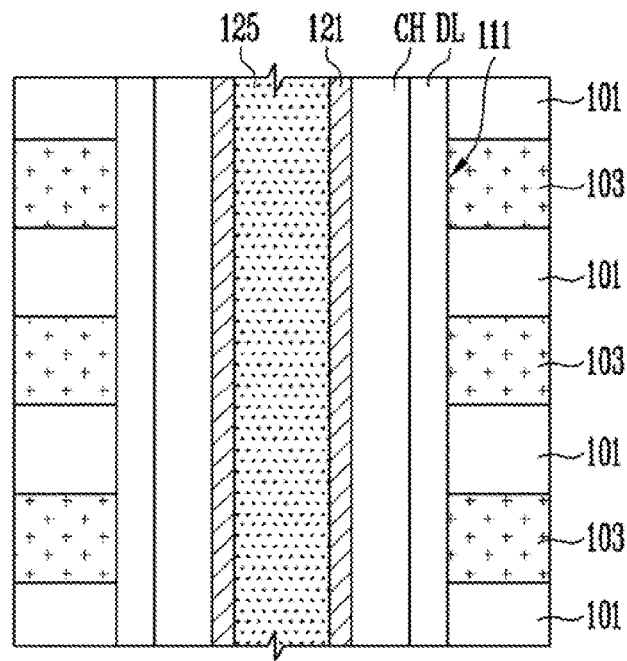

Referring to FIG. 3C, a dopant supply film 125 may be formed to contact the buffer film 121 and to fill the hole 111. The dopant supply film 125 may be formed in the SA5 step or in the SB7 step as described above with reference to FIG. 2A and FIG. 2B.

Figure 3D:
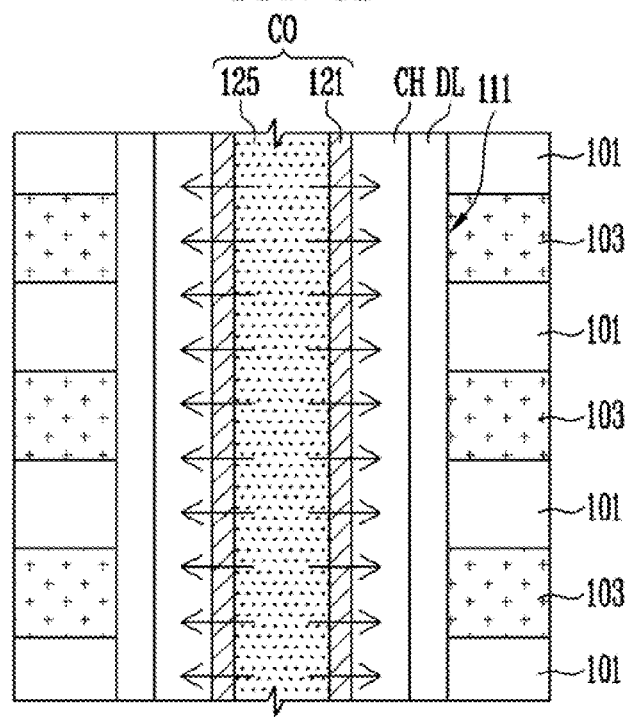

Referring to FIG. 3D, a doped channel film CH may be formed by heat treatment to enable a reflow of the dopant supply film 125 and an dopant diffusion from the dopant supply film 125 into the channel film CH. The formation process of the doped channel film CH may be realized in the SA7 step or SB9 step as described above with reference to FIG. 2A and FIG. 2B.

The above heat process may yield the core structure CO including the dopant supply film 125 and buffer film 121, and the doped channel film CH surrounding the core structure CO.

A subsequent process from this stage may vary depending on properties of the first material films 101 and second material films 103.

For example, when the first material films 101 are made of insulation materials, and the second material films 103 are made of conductive materials, there may be formed a slit (SI1 in FIG. 1A or SI in FIG. 1B) passing-through an entirety of the first material films 101 and second material films 103, and a slit (SI2 in FIG. 1A) passing-through portions of the first material films 101 and second material films 103. This may result in the conductive patterns (USL, WL, LSL in FIG. 1A; or DSL, SSL, WL_D, WL_S in FIG. 1B) made of the second material films 103 and separated from each other by the slits (SI1, SI2, SI).

Figure 3E:
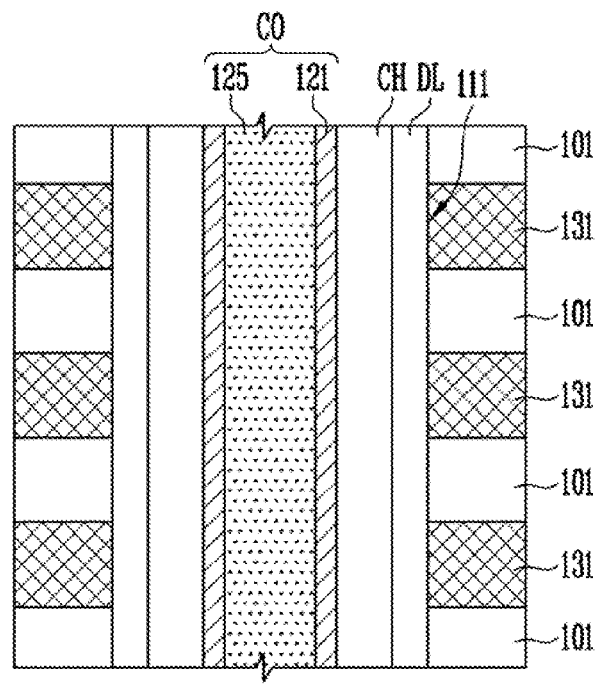

If the first material films 101 are made of oxide films and the second material films 103 are made of sacrificial nitride films, then the second material films 103 may be selectively removed via the slit (SI1 in FIG. 1A or SI in FIG. 1B) to open conductive pattern regions between the first material films 101. Next, as shown in FIG. 3E, the conductive pattern regions may be filled with conductive materials 131 to form the conductive patterns (USL, WL, LSL in FIG. 1A; or DSL, SSL, WL_D, WL_S in FIG. 1B). Thereafter, the slit (SI2 in FIG. 1A) may be formed to separate the upper-most level conductive patterns (USL in FIG. 1A) from each other.

Although not shown in the figures, if the first material films 101 are made of sacrificial un-doped silicon films and the second material films 103 are made of doped silicon films which are conductive patterns, then the first material films 101 may be selectively removed through the slit to open insulation regions between the second material films 103. Next, the insulation regions may be filled with insulation materials.

Figure 4:
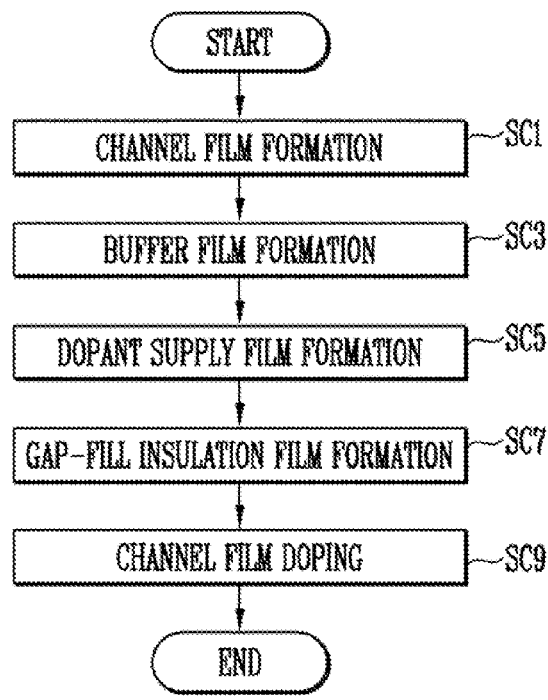
FIG. 4 illustrates a flow chart of a method of forming a doped channel film in accordance with an embodiment of the present disclosure.

FIG. 4 is a flow-diagram of a method of forming a doped channel film in accordance with an embodiment of the present disclosure. Referring FIG. 4, along and/or on an inner surface of a hole which passes through a previously-formed stack, a channel film may be formed at a SC1 step. The SC1 step may be the same as the SA1 step or SB1 step as described above with reference to FIG. 2A and FIG. 2B.

Subsequently, a buffer film may be formed on/along an inner surface of the channel film in a SA3 step or SB3 step as described above with reference to FIG. 2A and FIG. 2B. After this, in a SB5 step, an annealing treatment may be carried out as above-mentioned to densify the buffer film.

Next, in a SC5 step, along/on an inner surface of the buffer film, there may be formed a dopant supply film. The dopant supply film may serve to supply dopants into the channel film, and may contain a higher dopant concentration than the channel film.

The dopant supply film may contain therein N-type impurities or P-type impurities or both of the N-type impurities and P-type impurities. The dopant supply film may, for example, be a doped oxide film containing therein at least one type impurities of the N-type impurities and P-type impurities. The doped oxide film may be configured to be thin so that a central region of the hole is hollow. That is, the doped oxide film may be formed in a tube structure. Such a structure may be formed using a deposition method such as a LPCVD, PECVD, ALD and the like. The doped oxide film may contain, as the N-type impurities, phosphorus or arsenic dopants. In another embodiment, the doped oxide film may contain therein, as the P-type impurities, boron dopants.

Thereafter, in a SC7 step, the hole may be filled with a gap-fill insulation film. The gap-fill insulation film may be composed of a fluidic material to facilitate filling of an elongated hole. For example, the gap-fill insulation film may include polysilazane ("PSZ"). The gap-fill insulation film may contact the dopant supply film.

In a SC9 step, the gap-fill insulation film may be subjected to heat treatment for an annealing. In this way, the gap-fill insulation film may be cured. Upon the heat treatment of the gap-fill insulation film, the dopants may diffuse from the dopant supply film into the channel film. In this manner, the present disclosure may form the doped channel film and cure the gap-fill insulation film at the same time.

Figure 5A:
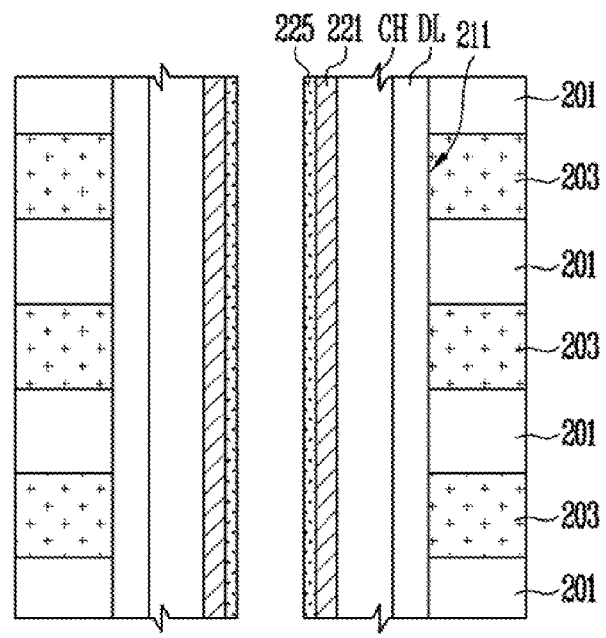
FIG. 5A to FIG. 5C illustrates cross-sectional views corresponding to various stages in the method of manufacturing the semiconductor device as in FIG. 4.
Figure 5B:
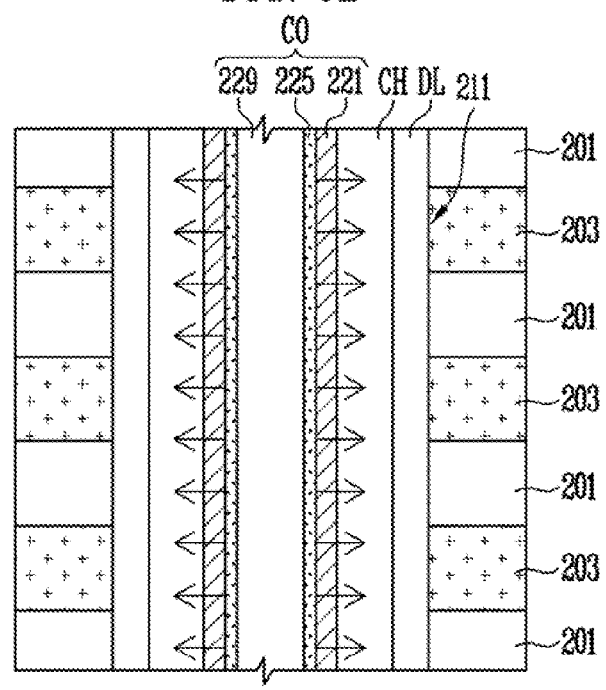
Figure 5C:
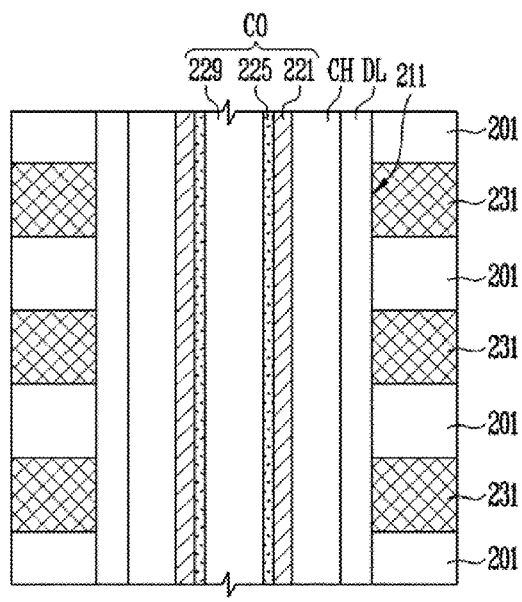

FIG. 5A to FIG. 5C are cross-sectional views corresponding to various stages in the method of manufacturing the semiconductor device as in FIG. 4. Referring to FIG. 5A, each of first material films 201 and each of second material films 203 may be alternately stacked on a substrate (not shown) having an underlying structure. The underlying structure may include the substrate SUB with the source region as shown in FIG. 1A or include the substrate SUB with the pipe gate PG as shown in FIG. 1B. The first material films 201 and second material films 203 may be made as described above with reference to FIG. 3A.

Thereafter, the first material films 201 and second material films 203 may be etched to form a hole 211 passing-through the first material films 201 and the second material films 203. The hole 211 may a filing region of the channel film CH and core structure CO as shown in FIG. 1A, or a filling region of the drain-side channel film D_CH and core structure CO as shown in FIG. 1B, or a filling region of the source-side channel film S_CH and core structure CO as shown in FIG. 1B.

Next, in the SC1 step as described above in FIG. 4, along/on an inner surface of the hole 211, a channel film CH may be formed. Prior to the channel film CH formation, a data storage film DL may be formed in a single or multiple-layer structure along/on the inner surface of the hole 211. Configuration details on the data storage film DL may be the same as those above-mentioned in FIG. 3A.

Subsequently, in the SC3 step and SC5 step as described above in FIG. 4, a buffer film 221 and a dopant supply film 225 may be formed. The buffer film 221 may contact the channel film CH. The dopant supply film 225 may contact the buffer film 221. Prior to the dopant supply film 225 formation, the buffer film 221 may be densified by the SB5 step as described above in FIG. 2B.

With reference to FIG. 5B, in the SC7 step as described above in FIG. 4, a gap-fill insulation film 229 may be filled in the hole 211 to contact the dopant supply film 225. After this, in the SC9 step as described above in FIG. 4, the gap-fill insulation film 229 may be subjected to heat treatment, by which the gap-fill insulation film 229 may be annealed and, at the same time, the dopants may diffuse from the dopant supply film 225 to the channel film CH. This may result in formation of a doped channel film CH.

Upon the above-mentioned heat treatment, there may be formed the core structure CO including the gap-fill insulation film 229, dopant supply film 225 and buffer film 221, and the doped channel film CH surrounding the core structure CO.

A subsequent process from this stage may vary depending on properties of the first material films 201 and second material films 203. For example, when the first material films 201 are made of insulation materials and the second material films 203 are made of conductive materials, the slits (SI1, SI2, SI) may be formed as shown in FIG. 1A and FIG. 1B. This may result in the conductive patterns (USL, WL, LSL in FIG. 1A; or DSL, SSL, WL_D, WL_S in FIG. 1B) which are made of the second material films 103 to be separated from each other via the slits (SI1, SI2, SI).

When the first material films 201 are made of oxide films and the second material films 203 are made of sacrificial nitride films, as shown in FIG. 5C, the second material films 203 may be replaced with conductive materials 231 to form the conductive patterns (USL, WL, LSL in FIG. 1A; or DSL, SSL, WL_D, WL_S in FIG. 1B). A step employed to replace the second material films 203 with the conductive material 231 may be the same as that as described above with reference to FIG. 3E. In addition, the first material films 201 made of the sacrificial un-doped silicon films may be replaced with insulation materials.

Figure 6:
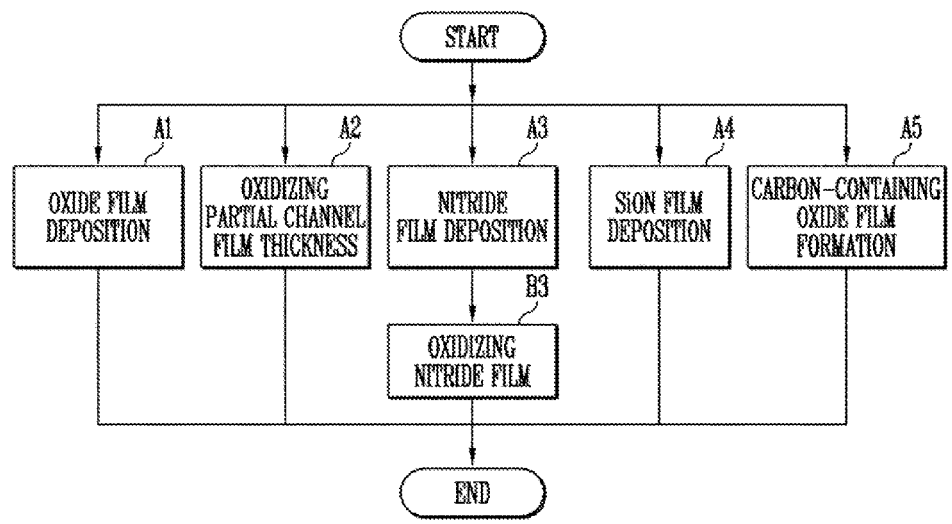
FIG. 6 illustrates a flow chart of a method of forming a buffer film according to an embodiment of the present disclosure.

FIG. 6 is a flow-diagram of a method of forming a buffer film according to an embodiment of the present disclosure. With reference to FIG. 6, the buffer film formation may be realized in A1 to A5 steps.

In the A1 step, the buffer film may be formed by depositing an oxide film along/on an inner surface of the channel film using a LPCVD, PECVD, ALD, and the like. In this case, in order to densify the buffer film, annealing treatment may be further carried out toward the buffer film.

In the A2 step, the buffer film may be formed by oxidizing the channel film to a given thickness, resulting in the channel film with a target thickness. In this case, during a previous deposition of the channel film, the channel film deposition thickness may be larger than the target thickness.

The buffer film may be formed by depositing a nitride film along/on an inner surface of the channel film in the A3 step, and then oxidizing the deposited nitride film in a B3 step. In this case, during the heat treatment for a doped channel film formation, excessive dopant diffusion may be suppressed due to nitrogen contained in the buffer film.

In the A4 step, the buffer film may be formed by depositing an oxynitride film (SiON) along/on the inner surface of the channel film. In this case, during the heat treatment for a doped channel film formation, excessive dopant diffusion may be suppressed due to nitrogen contained in the buffer film.

In the A5 step, the buffer film may be formed by depositing a carbon-containing oxide film along/on the inner surface of the channel film. In this case, during the heat treatment for a doped channel film formation, excessive dopant diffusion may be suppressed due to carbon contained in the buffer film.

In any one of the A3 to A5 steps, excessive dopant diffusion into the channel film may be suppressed due to carbon or nitrogen contained in the buffer film. In this way, the buffer film densification may be omitted.

FIG. 7A and FIG. 7B are cross-sectional views corresponding to various stages in a method of manufacturing a semiconductor device in accordance with one embodiment of the present disclosure. Referring to FIG. 7A, each of first material films 301 and each of second material films 303 may be alternately stacked on a substrate (not shown) having an underlying structure. The underlying structure may include the substrate SUB with the source region as shown in FIG. 1A, or include the substrate SUB with the pipe gate PG as shown in FIG. 1B.

The first material films 301 and second material films 303 may be made as described above with reference to FIG. 3A. Thereafter, the first material films 301 and second material films 303 may be etched to form a hole 311. The hole 311 may be a filing region in which a channel film CH and core structure CO will be formed.

Next, in the SC1 step as described above in FIG. 4, along/on an inner surface of the hole 311, a channel film CH may be formed. Prior to the channel film CH formation, a data storage film DL may be formed in a single or multiple-layer structure along/on the inner surface of the hole 311. Configuration details on the data storage film DL may be the same as those above-mentioned in FIG. 3A.

Subsequently, in the SC5 step as described above in FIG. 4, a dopant supply film 325 may be formed. The dopant supply film 325 may be formed using a deposition technique such as a LPCVD, ALD, and the like. The dopant supply film 325 may contact the channel film CH. The dopant supply film 325 may be made of a doped oxide film with a dopant therein. The dopant in the doped oxide film may include N type dopants and/or P dopants. For example, the dopant may include at least one of a boron, phosphorus, and arsenic.

Next, in the SC7 step as described above in FIG. 4, a gap-fill insulation film 329 may be filled in the hole 311 to contact the dopant supply film 325. After this, in the SC9 step as described above in FIG. 4, the gap-fill insulation film 329 may be subjected to heat treatment, by which the gap-fill insulation film 329 may be annealed and, at the same time, the dopants may diffuse from the dopant supply film 325 to the channel film CH. This may result in formation of a doped channel film CH.

Upon the above-mentioned heat treatment, there may be formed the core structure CO including the gap-fill insulation film 329 and dopant supply film 325, and the doped channel film CH surrounding the core structure CO.

A subsequent process from this stage may vary depending on properties of the first material films 301 and second material films 303. For example, when the first material films 301 are made of insulation materials and the second material films 303 are made of conductive materials, the slits (SI1, SI2, SI) may be formed as shown in FIG. 1A and FIG. 1B. This may result in the conductive patterns (USL, WL, LSL in FIG. 1A; or DSL, SSL, WL_D, WL_S in FIG. 1B) which are made of the second material films 103 to be separated from each other via the slits (SI1, SI2, SI).

When the first material films 301 are made of oxide films and the second material films 303 are made of sacrificial nitride films, as shown in FIG. 7B, the second material films 303 may be replaced with conductive materials 331 to form the conductive patterns (USL, WL, LSL in FIG. 1A; or DSL, SSL, WL_D, WL_S in FIG. 1B). A step employed to replace the second material films 303 with the conductive material 331 may be the same as that described above in FIG. 3E. In addition, the first material films 301 made of the sacrificial un-doped silicon films may be replaced with insulation materials.

The present disclosure may enhance the doping concentration of the channel film in the 3D memory device including the channel film passing-through the vertical stack to increase a reliability of the 3D memory device. The present disclosure may control the doping concentration of the channel film by supply of the dopants from the dopant supply film into the channel film. The present disclosure may enhance the doping concentration of the channel film.

The present disclosure may increase a charge mobility rate due to the increase in the doping concentration of the channel film. Thus, the present disclosure may enhance a cell current of the cell-string formed along the channel film. As a result, the present disclosure may reduce a sensing time taken to read the memory cell and narrow threshold voltage distributions depending on the data storage states. The present disclosure may enhance the threshold voltage of the selection transistor formed along the channel film due to the increase in the doping concentration of the channel film. In this approach, the present disclosure may reduce a selection transistor-side leakage current, resulting in suppression of disturbing degradations.

Figure 8:
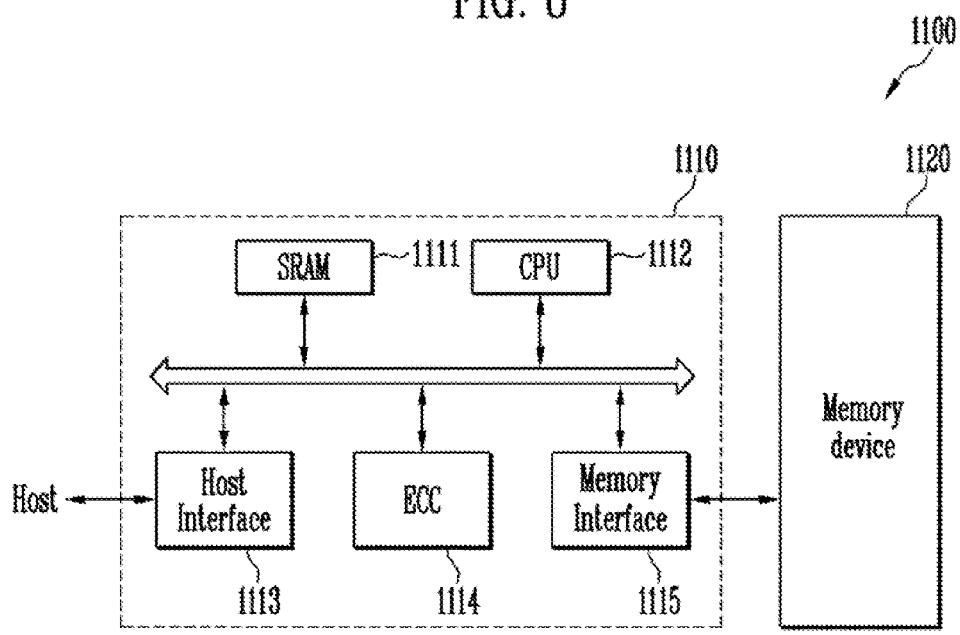
FIG. 8 illustrates a block diagram of an embodiment of a memory system in accordance with the present disclosure.

FIG. 8 is a block diagram of an embodiment of a memory system in accordance with the present disclosure. Referring to FIG. 8, a memory system 1100 in accordance with the present disclosure may include a memory device 1120 and a memory device controller 1110.

The memory device 1120 may include the configurations as mentioned above FIG. 1A and FIG. 1B and may be formed using various manufacturing methods as described above in FIG. 2A to FIG. 7B. For example, the memory device 1120 may include the tube-structured doped channel film. Furthermore, the memory device 1120 may be a multi-chips package including a plurality of flash memory chips.

The memory device controller 1110 may be configured to control the memory device 1120 and may include a SRAM 1111, CPU 1112, host interface 1113, ECC 1114, and memory interface 1115. The SRAM 1111 may be employed as a work memory for the CPU 1112. The processing unit 1112 may execute overall control operations of the controller 1110 to exchange data. The host interface 1113 may have a data exchange protocol of a host that is, a system connected to the memory system 1100. The error correction block 1114 may detect and correct errors contained in data read from the memory device 1120. The memory interface 1115 may interface with the semiconductor memory device 1120 according to the present disclosure. Although not shown in the figure, the controller 1110 of the memory system 1100 according to the present disclosure may be further provided with a read only memory (ROM) (not shown) to store code data to interface with the host system or host.

In the memory system 1100 as shown in FIG. 8, the semiconductor memory device 1120 and the controller 1110 may be combined to be implemented as a memory card or semiconductor disk device such as a solid State Disk (SSD). In one example, when the memory system 1100 is implemented as the SSD, externals such as, a host system (not shown) and the controller 1110 may be connected to each other via various interfaces. For instance, the interfaces may include standard interfaces such as multimedia card (MMC), enhanced small device interface (ESDI), Parallel Advanced Technology Attachment (PATA), serial Advanced Technology Attachment (SATA), Small Computer Small Interface (SCSI), Serial Attached SCSI (SAS), Universal Serial Bus (USB), PCI express (PCIe), integrated device electronics (IDE), and the like.

Figure 9:
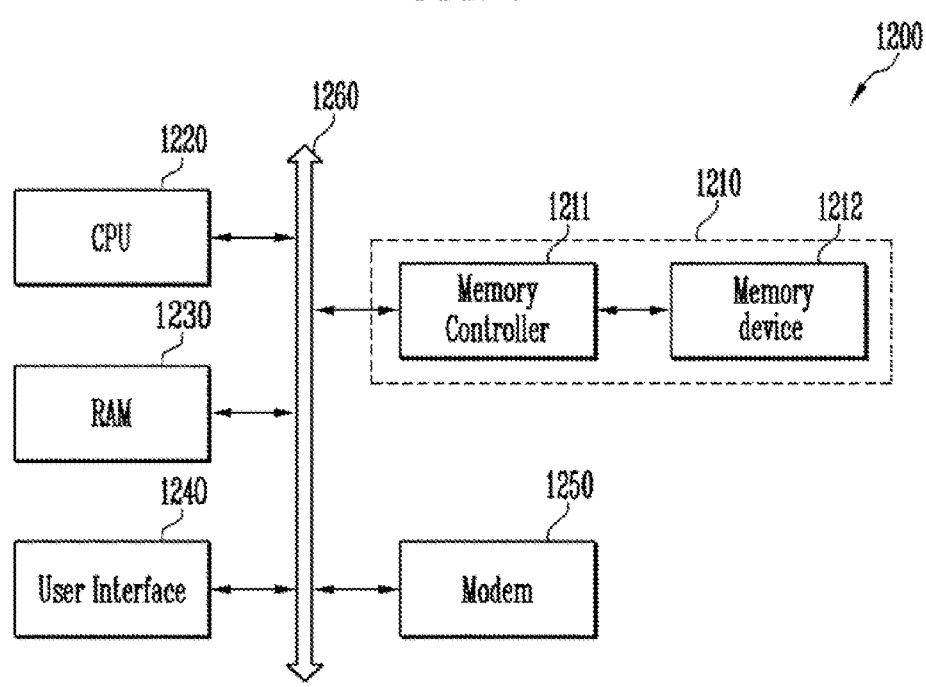
FIG. 9 illustrates a configuration diagram of a computing system in accordance with an embodiment of the present disclosure.

FIG. 9 is a configuration diagram of a computing system in accordance with an embodiment of the present disclosure. Referring to FIG. 9, the computing system 1200 in accordance with an embodiment of the present disclosure may include a CPU 1220, RAM 1230, user interface 1240, modem 1250, and memory system 1210, all of which are electrically connected to each other via a system bus 1260. Furthermore, when the computing system 1200 is implemented in a mobile device, the computing system 1200 may be further provided with a battery (not shown) to supply an operation voltage thereof and may be further provided with an application chipset, camera image processor (CIS), mobile DRAM, etc.

The memory system 1210 may include the memory device 1212 and the memory device controller 1211, as above-mentioned in FIG. 8. Although the present disclosure has been described with reference to limited embodiments and drawings, the present disclosure is not limited thereto. The present disclosure may encompass variations and modifications thereto. Therefore, a scope of the present disclosure may not be limited to the embodiments as described above, but, rather, may be defined by the following claims and their equivalents.

The different functions discussed herein may be performed in a different order and/or concurrently with each other. Furthermore, one or more of the above-described functions may be optional or may be combined. Although various aspects of the embodiments are set out in the independent claims, other aspects comprise other combinations of features from the described embodiments and/or the dependent claims with the features of the independent claims, and are not solely the combinations explicitly set out in the claims.

It is also noted herein that while the above describes example embodiments of the invention, these descriptions should not be viewed in a limiting sense. Rather, there are several variations and modifications which may be made without departing from the scope of the present disclosure as defined in the appended claims.

What is claimed is:

1. A method for manufacturing a semiconductor device, comprising:
   forming a hole passing through a stack, wherein the stack includes first and second material films;
   forming a channel film over an inner surface of the hole;
   forming a buffer film over an inner surface of the channel film;
   densifying the buffer film by annealing treatment;
   forming a dopant supply film being in contact with a densified buffer film and filling the hole; and
   doping the channel film by dopant diffusion from the dopant supply film into the channel film,
   wherein the buffer film is disposed between the channel film and the dopant supply film, and
   wherein prior to the forming of the dopant supply film, the annealing treatment is performed so that the dopant supply film directly contacts the densified buffer film.

2. The method of claim 1, wherein the channel film includes an un-doped silicon film in a tube structure.

3. The method of claim 1, wherein the buffer film includes an oxide film, a nitride film, an oxynitride film (SiON), a carbon-containing oxide film, or a combination thereof.

4. The method of claim 1, wherein the forming of the buffer film comprises partially oxidizing the channel film.

5. The method of claim 1, wherein the forming of the buffer film comprises;
   forming a nitride film over the inner surface of the channel film; and
   oxidizing the nitride film.

6. The method of claim 1, wherein the doping of the channel film is performed by heat treatment to reflow the dopant supply film.

7. The method of claim 1, wherein the dopant supply film includes PhosphoSilicate Glass (PSG), Borosilicate Glass (BSG), BoroPhosphoSilicate Glass (BPSG), or a combination thereof.

8. A method for manufacturing a semiconductor device, comprising:
   forming a hole passing through a stack, wherein the stack includes first and second material films;
   forming a channel film over an inner surface of the hole;
   forming a dopant supply film over an inner surface of the channel film;
   forming a gap-fill insulation film being in contact with the dopant supply film and filling the hole; and
   doping the channel film by dopant diffusion from the dopant supply film into the channel film by heat treatment, wherein the heat treatment is performed to anneal the gap-fill insulation film.

9. The method of claim 8, further comprising:
   prior to forming the dopant supply film, forming a buffer film being in contact with the channel film.

10. The method of claim 9, further comprising, prior to forming the dopant supply film, densifying the buffer film via an annealing treatment.

11. The method of claim 9, wherein the buffer film includes an oxide film, a nitride film, an oxynitride film (SiON), a carbon-containing oxide film, or a combination thereof.

12. The method of claim 9, wherein the forming of the buffer film comprises partially oxidizing the channel film.

13. The method of claim 9, wherein the forming of the buffer film comprises;
   forming a nitride film over the inner surface of the channel film; and
   oxidizing the nitride film.

14. The method of claim 8, wherein the dopant supply film is in contact with the channel film.

15. The method of claim 8, wherein the dopant supply film includes a doped oxide film with a dopant therein.

16. The method of claim 15, wherein the dopant includes boron, phosphorus, or arsenic.

17. The method of claim 8, wherein the gap-fill insulation film includes polysilazane (PSZ).

18. A method for manufacturing a semiconductor device, comprising:
   forming a hole passing through a stack, wherein the stack includes first and second material films;
   forming a channel film over an inner surface of the hole;
   forming a buffer film over an inner surface of the channel film;
   forming a dopant supply film over an inner surface of the buffer film;
   forming a gap-fill insulation film over an inner surface of the dopant supply film and filling the hole; and
   doping the channel film by dopant diffusion from the dopant supply film into the channel film,
   wherein the buffer film is disposed between the channel film and the dopant supply film.

19. The method of claim 18, wherein the doping of the channel film is performed by heat treatment.

* * * * *